(12) United States Patent
Lao et al.

(10) Patent No.: US 9,978,861 B2
(45) Date of Patent: May 22, 2018

(54) SEMICONDUCTOR DEVICE HAVING GATE IN TRENCHES

(71) Applicant: Vanguard International Semiconductor Corporation, Hsinchu (TW)

(72) Inventors: Chung-Ren Lao, Taichung (TW); Hsing-Chao Liu, Jhudong Township (TW); Chih-Jen Huang, Dongshan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 61 days.

(21) Appl. No.: 14/248,942

(22) Filed: Apr. 9, 2014

(65) Prior Publication Data

US 2015/0295032 A1 Oct. 15, 2015

(51) Int. Cl.

| H01L 29/76 | (2006.01) |
|---|---|
| H01L 29/78 | (2006.01) |
| H01L 29/423 | (2006.01) |
| H01L 21/762 | (2006.01) |
| H01L 29/66 | (2006.01) |
| H01L 29/06 | (2006.01) |
| H01L 29/10 | (2006.01) |
| H01L 29/51 | (2006.01) |

(52) U.S. Cl.
CPC .... *H01L 29/7825* (2013.01); *H01L 21/76224* (2013.01); *H01L 29/0649* (2013.01); *H01L 29/1037* (2013.01); *H01L 29/4236* (2013.01); *H01L 29/42364* (2013.01); *H01L 29/66621* (2013.01); *H01L 29/66734* (2013.01); *H01L 29/78* (2013.01); *H01L 29/517* (2013.01); *H01L 29/518* (2013.01); *H01L 29/7813* (2013.01)

(58) Field of Classification Search
CPC .............. H01L 29/4236; H01L 29/0653; H01L 29/66613; H01L 29/42372; H01L 29/78; H01L 29/517; H01L 29/42364; H01L 29/66621; H01L 29/7825; H01L 29/0649
USPC ................ 257/330, 331, 332, 341, 506, 510
See application file for complete search history.

(56) References Cited

U.S. PATENT DOCUMENTS

| 4,903,189 A * | 2/1990 | Ngo ...................... H01L 29/7722 257/331 |
| 5,142,640 A * | 8/1992 | Iwamatsu ........... H01L 29/7834 257/332 |

(Continued)

FOREIGN PATENT DOCUMENTS

| CN | 103367224 A | 10/2013 |
| TW | 200744218 A | 12/2007 |

(Continued)

*Primary Examiner* — Shouxiang Hu
(74) *Attorney, Agent, or Firm* — Birch, Stewart, Kolasch & Birch, LLP

(57) ABSTRACT

A semiconductor device is disclosed. The semiconductor device includes a substrate having an isolation region and an active region defined by the isolation region. At least one trench is formed in the active region and extends along a first direction. A gate layer is disposed on the active region and extends along a second direction, wherein the gate layer conformably fills the at least one trench and covers a bottom surface and sidewalls of the at least one trench. The disclosure also provides a method for manufacturing the semiconductor device.

9 Claims, 5 Drawing Sheets

(56) References Cited

U.S. PATENT DOCUMENTS

| | | | | |
|---|---|---|---|---|
| 5,932,911 | A * | 8/1999 | Yue | B82Y 10/00 |
| | | | | 257/330 |
| 6,355,532 | B1 * | 3/2002 | Seliskar | B82Y 10/00 |
| | | | | 257/E21.404 |
| 6,436,798 | B2 * | 8/2002 | Fu | H01L 21/28114 |
| | | | | 257/E21.205 |
| 7,786,529 | B2 * | 8/2010 | Kim | H01L 21/823418 |
| | | | | 257/330 |
| 2002/0003257 | A1 | 1/2002 | Fu | |
| 2005/0056888 | A1 * | 3/2005 | Youn | H01L 21/823437 |
| | | | | 257/331 |
| 2006/0261407 | A1 * | 11/2006 | Blanchard | H01L 23/535 |
| | | | | 257/330 |
| 2008/0048251 | A1 * | 2/2008 | Disney | H01L 21/82385 |
| | | | | 257/330 |
| 2008/0128774 | A1 * | 6/2008 | Irani | H01L 21/76232 |
| | | | | 257/314 |
| 2011/0062492 | A1 * | 3/2011 | Ko | H01L 21/76224 |
| | | | | 257/190 |
| 2012/0326207 | A1 * | 12/2012 | Yoshimochi | H01L 29/866 |
| | | | | 257/139 |
| 2013/0011983 | A1 * | 1/2013 | Tsai | H01L 21/823807 |
| | | | | 438/285 |

FOREIGN PATENT DOCUMENTS

| | | |
|---|---|---|
| TW | 200814141 A | 3/2008 |
| TW | 201005874 A1 | 2/2010 |

* cited by examiner

SEMICONDUCTOR DEVICE HAVING GATE IN TRENCHES

BACKGROUND OF THE INVENTION

Field of the Invention

The present invention relates to a semiconductor technique, and more particularly, to a semiconductor device and a method for manufacturing the same.

Description of the Related Art

As generations of integrated circuits (ICs) progress, a constant goal of the semiconductor industry is to improve the driving current of the device so as to enhance the computing efficiency thereof. When the size of devices are scaled to 130 nm or less, in particular to 65 nm or less, it is difficult to utilize conventional means, such as shortening the gate (or channel) length or increasing the capacitance of the gate oxide, to improve the driving current of the device.

According to semiconductor physics, the driving current of the metal oxide semiconductor field effect transistor (MOSFET) is proportional to the gate (or channel) width. In this regard, increasing the gate dimension in the channel width direction is a feasible way to improve the driving current. The increase in the gate dimension in the channel width direction, however, may cause large chip areas be occupied by the gate and adversely impact the scaling down process of the chip.

Therefore, a novel semiconductor device and a method for manufacturing the same are desired to improve the driving current thereof.

BRIEF SUMMARY OF INVENTION

A detailed description is given in the following embodiments with reference to the accompanying drawings. A semiconductor device and a method for manufacturing the same are provided.

An exemplary embodiment of a semiconductor device includes a substrate having an isolation region and an active region defined by the isolation region. At least one trench is formed in the active region and extends along a first direction. A gate layer is disposed on the active region and extends along a second direction, wherein the gate layer conformably fills the trench(es) and covers a bottom surface and sidewalls of the trench(es).

An exemplary embodiment of a method for manufacturing a semiconductor device includes providing a substrate. A plurality of first trenches are formed in the substrate, wherein the plurality of first trenches form an isolation region and define an active region in the substrate. At least one second trench is formed in the active region and extends along a first direction. An insulating material fills the plurality of first trenches. A gate layer is formed on the active region, wherein the gate layer extends along a second direction, and wherein the gate layer fills the at least one second trench and covers a bottom surface and sidewalls of the at least one second trench.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 2A-5A are plan views of a method for manufacturing a semiconductor device, in accordance with an embodiment.

FIGS. 2B-5B are cross-sectional views along the line A-A' of FIGS. 2A-5A, respectively.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 5A:
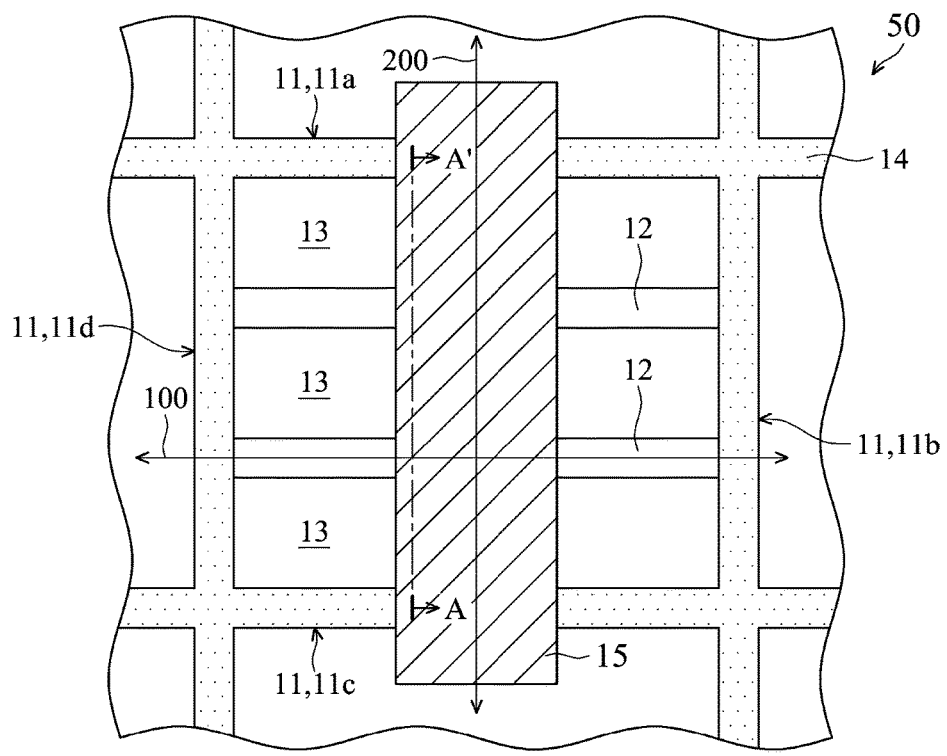
Figure 5B:
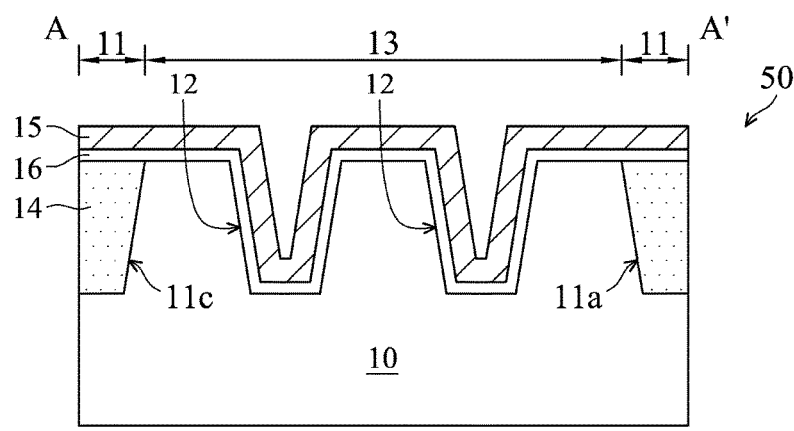

Referring to FIGS. 5A-5B. FIG. 5A is a plan view of a semiconductor device 50 in accordance with an embodiment, and FIG. 5B is a cross-sectional view along the line A-A' of FIG. 5A. In the embodiment, the semiconductor device 50 may comprise a low-voltage device or a high-voltage device. For example, the semiconductor device 50 may be a power device, which comprises a vertical double diffused MOSFET (VDMOS) or a lateral diffused MOSFET (LDMOS).

The semiconductor device 50 comprises a substrate 10 having an isolation region 11 and an active region 13 defined by the isolation region 11. In an embodiment, the isolation region 11 is a shallow trench isolation (STI) structure formed by first trenches 11a-11d filled with an insulating material 14, but it is not limited thereto. In another embodiment, the isolation region 11 may comprise any isolation structures known in the art, such as a local oxidation of silicon (LOCOS) structure.

At least one second trench 12 is formed in the substrate 10 corresponding to the active region 13 and extends along a first direction 100. In the embodiment, the semiconductor device 50 may comprise two second trenches 12, as shown in FIGS. 5A-5B, but it is not limited thereto. In another embodiment, the semiconductor device 50 may comprise more or fewer second trenches 12. Unlike the first trenches 11a-11d acting as the isolation region 11, the second trenches 12 have no insulating material 14 filled inside. Moreover, the extending direction of the second trenches 12 (i.e., the first direction 100) may or may not be parallel to the extending direction of the first trenches 11a and 11c.

In the embodiment, the aspect ratio of the second trenches 12 is between 0.3-0.8. For example, the depth of the second trenches 12 may range between 3000-4000 Å, and the width of the second trenches 12 may range between 5000-10000 Å.

A gate layer 15 is disposed on the substrate 10 corresponding to the active region 13 and extends along a second direction 200, wherein the gate layer 15 conformably fills the second trenches 12 and covers a bottom surface and sidewalls of the second trenches 12. In the embodiment, the gate layer 15 comprises metal, single-crystalline silicon, poly-crystalline silicon, a combination thereof, or any suitable conductive materials. In the embodiment, the thickness of the gate layer 15 is larger than 800 Å to prevent the gate layer 15 from being ruptured by the stress at corners of the second trenches 12.

A gate oxide layer 16 is disposed between the substrate 10 and the gate layer 15. In the embodiment, the gate oxide layer 16 may comprise $SiO_2$, $TiO_2$, $HfZrO$, $Ta_2O_3$, $HfSiO_4$, $ZrO_2$, $ZrSiO_2$, or a combination thereof or any suitable dielectric materials. The thickness of the gate oxide layer 16 is ranged between 30 Å-1000 Å.

In this embodiment, the extending direction of the second trenches 12 (i.e., the first direction 100) differs from the extending direction of the gate layer 15 (i.e., the second direction 200). For example, the second direction 200 is perpendicular to the first direction 100.

According to the embodiments mentioned above, by forming the second trenches 12 along the first direction 100 in the active region 13 and conformably filling the second trenches 12 with the gate layer 15 along the second direction 200, the gate (or channel) width of the semiconductor device 50 is increased while the size of the active region 13 is kept as originally designed. Accordingly, the driving current of the semiconductor device may be improved while the size of the chip is maintained.

Figure 1:
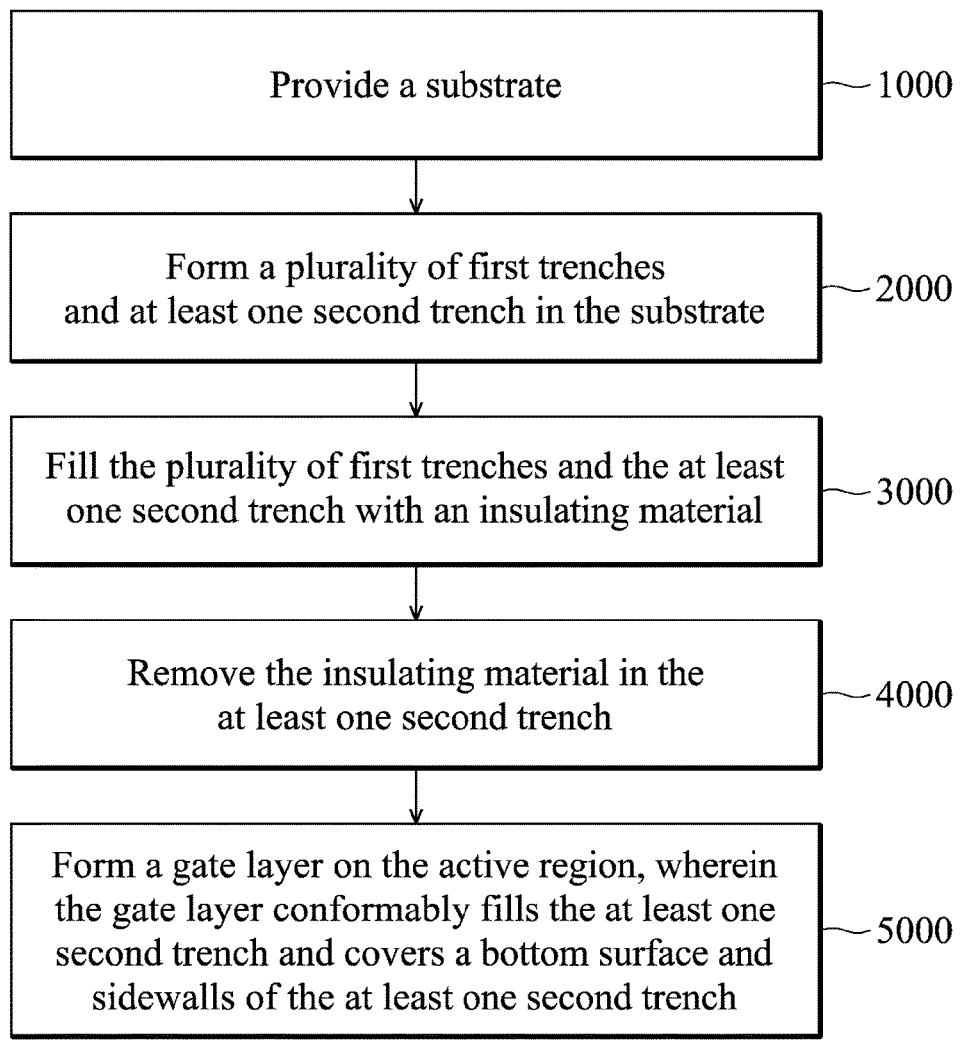
FIG. 1 shows a flowchart of a method for manufacturing a semiconductor device, in accordance with an embodiment.

A method for manufacturing a semiconductor device in accordance with an embodiment is described below. FIG. 1 shows a flowchart of a method for manufacturing a semiconductor device in accordance with an embodiment. FIGS. 2A-5A are plan views showing a method for manufacturing a semiconductor device in accordance with an embodiment. FIGS. 2B-5B are cross-sectional views along the line A-A' of FIGS. 2A-5A, respectively.

Figure 2A:
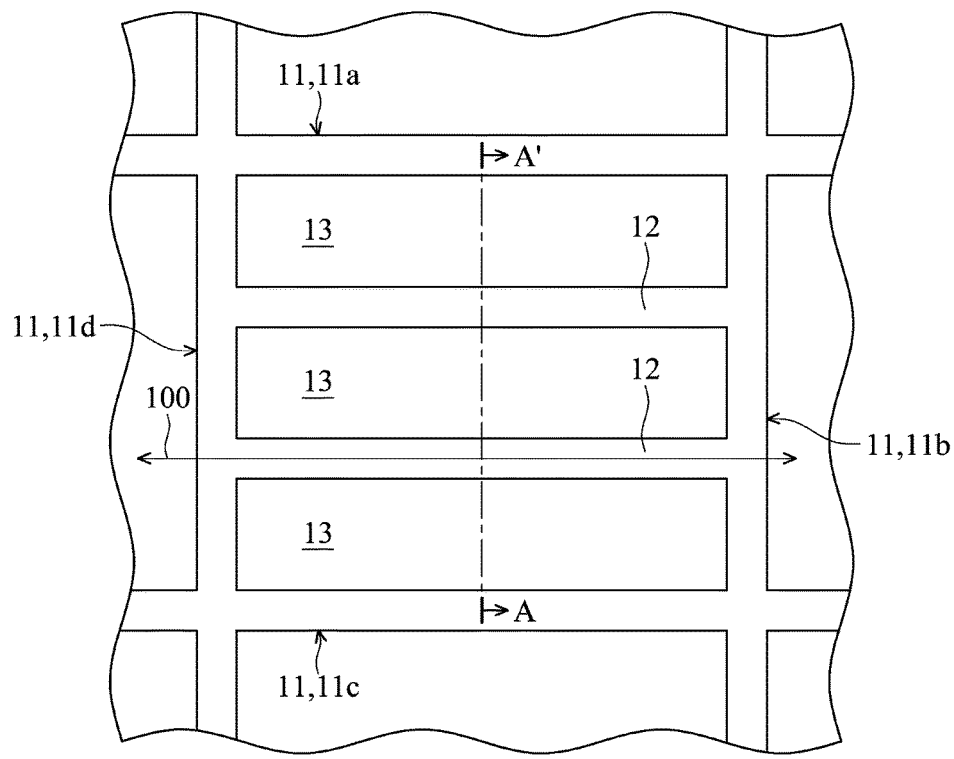
Figure 2B:
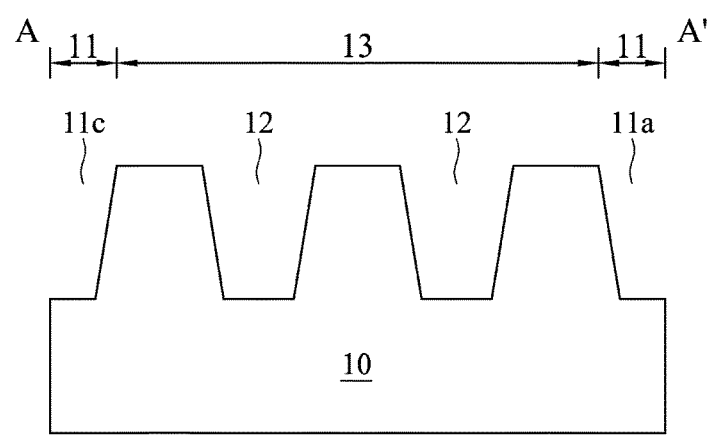

Referring to FIGS. 1 and 2A-2B, the method begins at block 1000 by providing a substrate 10. The substrate 10 may comprise a bulk substrate, an epitaxial substrate or a silicon-on-insulator (SOI) substrate. In an embodiment, the substrate 10 comprises elemental semiconductor such as crystalline silicon or germanium, or compound semiconductor such as silicon germanium, silicon carbide, gallium arsenide, gallium phosphide, indium phosphide, indium arsenide and/or indium antimonide. In an embodiment, the substrate 10 may be a p-type or n-type substrate, which depends on design demands.

Still referring to FIGS. 1 and 2A-2B, the method proceeds to block 2000 by forming a plurality of first trenches 11a-11d and at least one second trench 12 in the substrate 10. The first trenches 11a-11d form an isolation region 11 and define an active region 13 in the substrate 10, and the second trenches 12 are in the active region 13 and extend along a first direction 100. In the embodiment, two second trenches 12 may be formed in the substrate 10, as shown in FIGS. 2A-2B, but it is not limited thereto. In another embodiment, more or fewer second trenches 12 may be formed in the substrate 10. In this embodiment, the extending direction of the second trenches 12 (i.e., the first direction 100) may or may not be parallel to the extending direction of the first trenches 11a and 11c.

The first trenches 11a-11d and the second trenches 12 may be formed by standard lithography and etching processes, which are known to those skilled in the art and are not further described herein. In an embodiment, the first trenches 11a-11d and the second trenches 12 may be formed by the same lithography and etching processes, thus the first trenches 11a-11d and the second trenches 12 may have the same depth. In another embodiment, the first trenches 11a-11d and the second trenches 12 may be formed by different lithography and etching processes, such that the first trenches 11a-11d have a depth that is the same as or different from that of the second trenches 12.

In the embodiment, the depth of the second trenches 12 ranges between 3000 Å-4000 Å, and the width of the second trenches 12 ranges between 5000-10000 Å. Namely, the aspect ratio of the second trenches 12 is between 0.3-0.8.

In an embodiment, the second trenches 12 may extend to the isolation region 11 (e.g., the first trenches 11b and 11d).

In an embodiment, a liner layer (not shown) may be conformably formed on the sidewalls and bottom of the first trenches 11a-11d and/or the second trenches 12. By forming the liner layer, defects on the sidewalls and bottom of the first trenches 11a-11d and/or the second trenches 12, which is caused by the etching process, may be repaired. The liner layer may comprise silicon oxide, silicon nitride, silicon oxynitride or any suitable insulating materials. The liner layer may be formed by thermal oxidation, chemical vapor deposition (CVD), physical vapor deposition (PVD) or any suitable processes.

In an embodiment, the formation of the first trenches 11a-11d and the second trenches 12 comprises a corner-rounding step, which may relieve the stress at the corners of trenches.

Figure 3A:
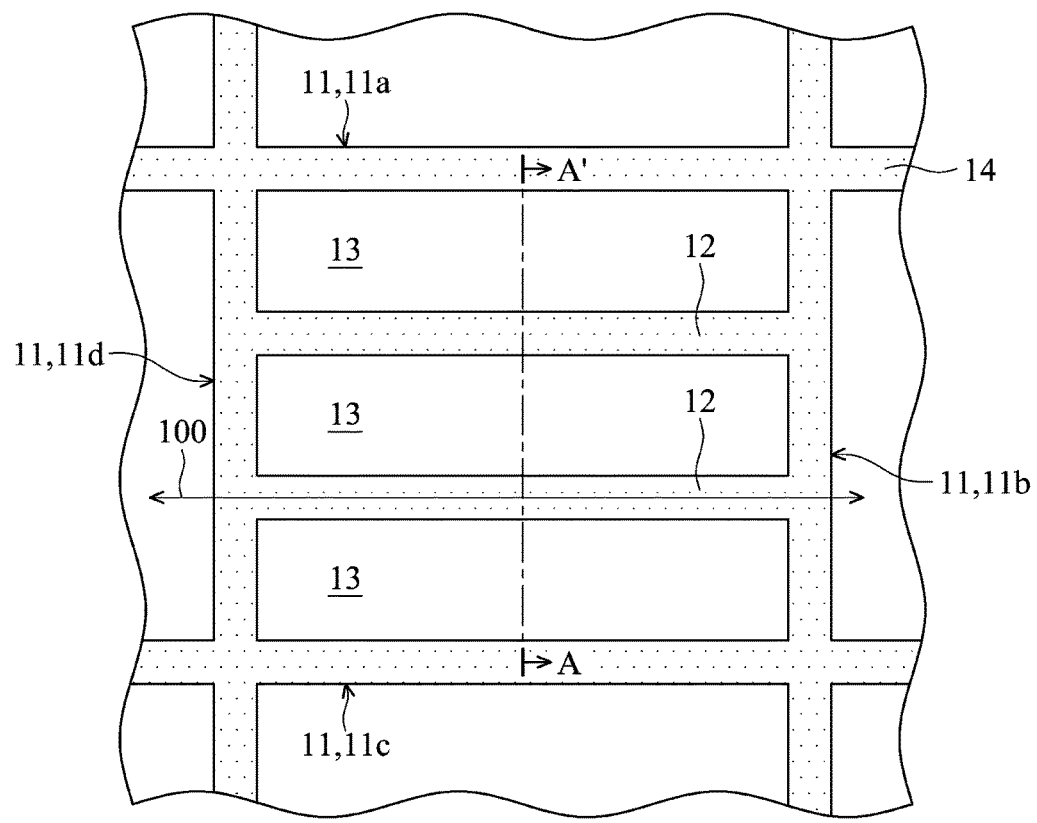
Figure 3B:
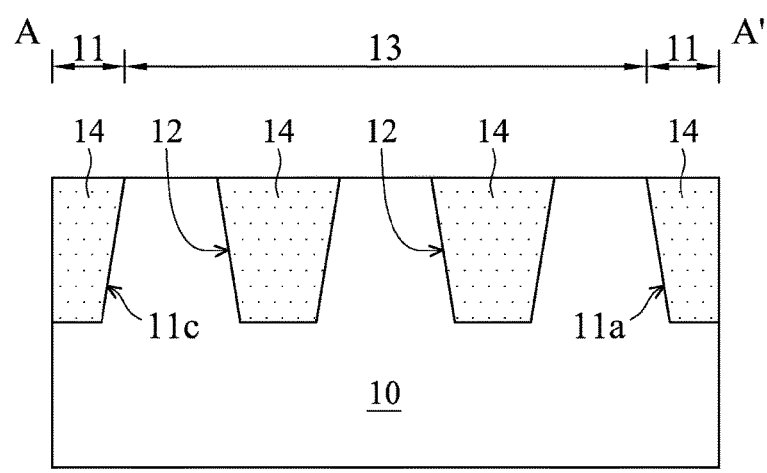

Referring to FIGS. 1 and 3A-3B, the method proceeds to block 3000 by filling the first trenches 11a-11d and the second trenches 12 with an insulating material 14. In the embodiment, the insulating material 14 comprises silicon oxide, silicon nitride, silicon oxynitride, fluoride-doped silicate glass (FSG), high density plasma (HDP) oxide and/or any known materials used in the isolation structure. In the embodiment, the insulating material 14 may be formed by CVD, spin-on coating or any suitable processes.

In an embodiment, the insulating material 14 may be blanketly formed on the substrate 10 to fill the first trenches 11a-11d and the second trenches 12. Then, a planarization process may be performed on the insulating material 14 to remove the excessive insulating material 14 above the substrate 10 and expose the substrate 10. The planarization process comprises grinding or chemical mechanical polishing (CMP).

Figure 4A:
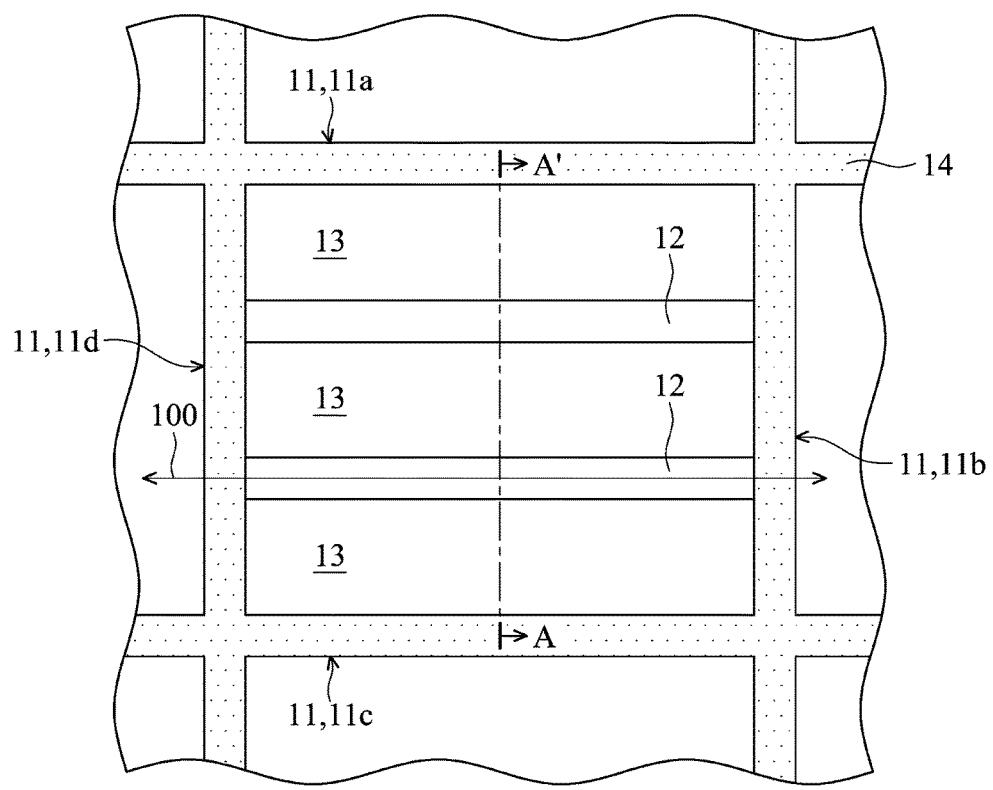
Figure 4B:
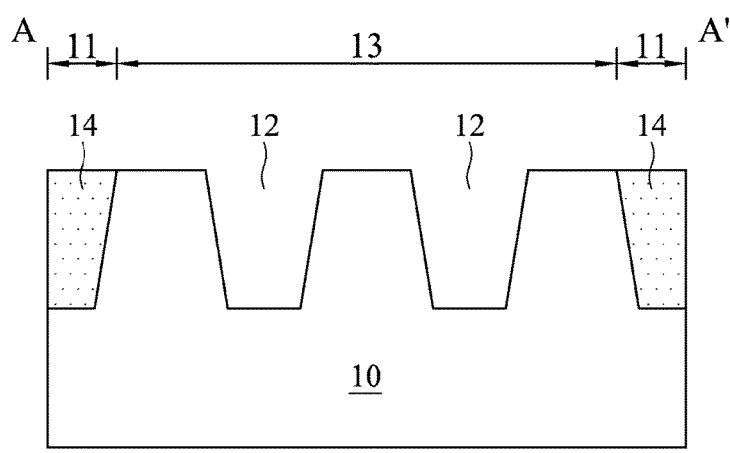

Referring to FIGS. 1 and 4A-4B, the method proceeds to block 4000 by removing the insulating material 14 in the second trenches 12. In the embodiment, the insulating material 14 in the second trenches 12 may be removed by a dry or wet etching process.

Referring to FIGS. 1 and 5A-5B, the method proceeds to block 5000 by forming a gate layer 15 on the substrate 10 corresponding to the active region 13. The gate layer 15 extends along a second direction 200, and the gate layer 15 conformably fills the second trenches 12 and covers a bottom surface and sidewalls of the second trenches 12. In the embodiment, the gate layer 15 comprises metal, single-crystalline silicon, poly-crystalline silicon or any suitable conductive materials. In the embodiment, the gate layer 15 may be formed by PVD, CVD, atomic layer deposition (ALD) or any suitable processes. In an embodiment, the thickness of the gate layer 15 is larger than 800 Å to prevent the gate layer 15 from being ruptured due to the stress at corners of the second trenches 12.

In the embodiment, the extending direction of the second trenches 12 (i.e., the first direction 100) differs from the extending direction of the gate layer 15 (i.e., the second direction 200). For example, the second direction 200 is perpendicular to the first direction 100.

Still referring to FIGS. 5A-5B. In the embodiment, a gate oxide layer 16 is formed between the gate layer 15 and the substrate 10. The gate oxide layer 16 may comprise $SiO_2$, $TiO_2$, $HfZrO$, $Ta_2O_3$, $HfSiO_4$, $ZrO_2$, $ZrSiO_2$, or a combination thereof or any suitable dielectric materials. In the embodiment, the gate oxide layer 16 may be formed by thermal oxidation, CVD, ALD, or any suitable processes. The thickness of the gate oxide layer 16 may be ranged between 30 Å-1000 Å.

In the embodiment, source and drain regions (S/D regions) may be formed in the substrate 10 corresponding to the active region 13 and disposed on both sides of the gate layer 15, respectively. The S/D regions may be a n-type or p-type doping region. The formation of the S/D regions is known to those skilled in the art and is not further described herein.

A method for manufacturing a semiconductor device in accordance with an embodiment is disclosed above. It should be appreciated, however, that the method for manufacturing the semiconductor device of the present invention is not limited thereto. For example, the first trenches 11a-11d may be formed and be filled with the insulating material 14 at first, and the second trenches 12 are formed thereafter. In the embodiment, the step for removing the insulating material 14 in the second trenches 12 is no longer needed.

Moreover, in the embodiment mentioned above, the isolation region 11 is formed by the first trenches 11a-11d, such as a STI structure, but it is not limited thereto. In another embodiment, the isolation region 11 may be any isolation structures known in the art, such as a LOCOS structure. In the embodiment, the LOCOS structure and the second trenches 12 may be formed in different stages of the process. The formation of the LOCOS structure is known to those skilled in the art and is not further described herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate having an isolation region including isolation trenches filled with an insulating material and an active region defined by the isolation trenches;
   a plurality of trenches formed in the active region, wherein each of the trenches has a width and a length greater than the width, and the length of each of the trenches extends along a first direction, wherein the isolation trenches have a depth that is the same as that of the plurality of trenches, wherein a top surface of the insulating material and a remaining top surface of the active region are substantially coplanar to each other; and
   a gate oxide layer and a gate layer successively and conformably filling the plurality of trenches to cover a bottom surface and sidewalls of the plurality of trenches and extending on the remaining top surface of the active region outside of the plurality of trenches, wherein the gate oxide layer and the gate layer have a width and a length greater than the width, and the lengths of the gate oxide layer and the gate layer extend along a second direction, the second direction being different from the first direction,
   wherein at least one of the isolation trenches has a width and a length greater than the width, and the width of the at least one of the isolation trenches extends along the second direction, and wherein the gate oxide layer and the gate layer extending along the second direction are across and beyond the width of the at least one of the isolation trenches, and wherein the gate oxide layer is above and in contact with the insulating material in the at least one of the isolation trenches.

2. The semiconductor device of claim 1, wherein the second direction is perpendicular to the first direction.

3. The semiconductor device of claim 1, wherein the each of the plurality of trenches extends to the isolation region along the first direction.

4. The semiconductor device of claim 1, wherein the gate layer has a thickness larger than 800 Å.

5. The semiconductor device of claim 1, wherein the at least one of the isolation trenches filled with the insulating material is a shallow trench isolation (STI) structure.

6. The semiconductor device of claim 1, wherein the gate oxide layer comprises $SiO_2$, $TiO_2$, $HfZrO$, $Ta_2O_3$, $HfSiO_4$, $ZrO_2$, $ZrSiO_2$ or a combination thereof.

7. The semiconductor device of claim 1, wherein the gate oxide layer has a thickness ranged between 30 Å-1000 Å.

8. The semiconductor device of claim 1, wherein the gate layer comprises metal, single-crystalline silicon, poly-crystalline silicon or a combination thereof.

9. The semiconductor device of claim 1, wherein the gate layer has an inner wall defining a recess at least partially in each of the plurality of trenches, and a top of the inner wall of the gate layer is substantially above a top of each of the plurality of trenches.

* * * * *